United States Patent
Park et al.

(10) Patent No.: US 8,981,550 B2
(45) Date of Patent: Mar. 17, 2015

(54) SEMICONDUCTOR PACKAGE WITH ALTERNATING THERMAL INTERFACE AND ADHESIVE MATERIALS AND METHOD FOR MANUFACTURING THE SAME

(71) Applicant: Amkor Technology, Inc., Chandler, AZ (US)

(72) Inventors: Joon Young Park, Seoul (KR); Jin Suk Jeong, Gyeonggi-do (KR); Kyeong Sool Seong, Seoul (KR); Seo Won Lee, Gyeonggi-do (KR)

(73) Assignee: Amkor Technology, Inc., Tempe, AZ (US)

( * ) Notice: Subject to any disclaimer, the term of this patent is extended or adjusted under 35 U.S.C. 154(b) by 0 days.

(21) Appl. No.: 13/725,645

(22) Filed: Dec. 21, 2012

(65) Prior Publication Data

US 2013/0214402 A1    Aug. 22, 2013

(30) Foreign Application Priority Data

Feb. 16, 2012  (KR) ........................ 10-2012-0015799

(51) Int. Cl.
| | | |
|---|---|---|
| *H01L 23/34* | (2006.01) | |
| *H01L 21/50* | (2006.01) | |
| *H01L 23/00* | (2006.01) | |
| *H01L 23/42* | (2006.01) | |

(52) U.S. Cl.
CPC ............... *H01L 23/34* (2013.01); *H01L 21/50* (2013.01); *H01L 24/29* (2013.01); *H01L 23/42* (2013.01); *H01L 2224/16225* (2013.01); *H01L 2224/32245* (2013.01); *H01L 2224/73253* (2013.01); *H01L 2924/16251* (2013.01); *H01L 24/16* (2013.01); *H01L 24/32* (2013.01); *H01L 24/73* (2013.01); *H01L 2224/29013* (2013.01); *H01L 2224/29014* (2013.01); *H01L 2224/29076* (2013.01); *H01L 2224/29078* (2013.01); *H01L 2224/2919* (2013.01)
USPC ........... 257/690; 257/713; 257/712; 257/778; 257/738; 257/737; 257/734; 257/704; 257/675; 257/676; 257/691

(58) Field of Classification Search
USPC ......... 257/713, 712, 778, 738, 737, 734, 704, 257/707, 675, 676, 690, 691
See application file for complete search history.

(56) References Cited

U.S. PATENT DOCUMENTS

| | | | | |
|---|---|---|---|---|
| 6,051,888 A | * | 4/2000 | Dahl ............................ | 257/778 |
| 6,294,408 B1 | * | 9/2001 | Edwards et al. .............. | 438/121 |
| 6,486,554 B2 | * | 11/2002 | Johnson ....................... | 257/738 |
| 6,943,436 B2 | * | 9/2005 | Radu et al. ................... | 257/678 |
| 6,967,403 B2 | * | 11/2005 | Chuang et al. ................ | 257/717 |
| 7,112,882 B2 | * | 9/2006 | Lee ............................... | 257/706 |
| 7,119,432 B2 | * | 10/2006 | Desai et al. ................... | 257/706 |
| 7,781,883 B2 | * | 8/2010 | Sri-Jayantha et al. ........ | 257/712 |
| 7,928,562 B2 | * | 4/2011 | Arvelo et al. ................. | 257/712 |
| 2004/0036183 A1 | * | 2/2004 | Im et al. ........................ | 257/796 |
| 2005/0056928 A1 | * | 3/2005 | Kwon et al. .................. | 257/718 |

(Continued)

*Primary Examiner* — Alexander Oscar Williams
(74) *Attorney, Agent, or Firm* — McAndrews, Held & Malloy (57) ABSTRACT

A semiconductor package improves reliability of heat emitting performance by maintaining a heat emitting lid stacked on a top surface of a semiconductor chip at a tightly adhered state. A highly adhesive interface material and a thermal interface material are applied to the top surface of the semiconductor chip. The highly adhesive interface material insures that the heat emitting lid is bonded to the top surface while the thermal interface material insures excellent heat transfer between the top surface and the heat emitting lid.

22 Claims, 6 Drawing Sheets

(56) References Cited

U.S. PATENT DOCUMENTS

| | | |
|---|---|---|
| 2005/0062154 A1* | 3/2005 | Duchesne et al. ............ 257/738 |
| 2010/0020503 A1* | 1/2010 | Beaumier et al. ............. 361/719 |
| 2010/0181665 A1* | 7/2010 | Casey et al. .................. 257/723 |
| 2010/0208432 A1* | 8/2010 | Bhagwagar et al. .......... 361/717 |
| 2012/0153453 A1* | 6/2012 | Ankireddi et al. ............ 257/712 |
| 2013/0052775 A1* | 2/2013 | Kim et al. ..................... 438/118 |
| 2013/0241039 A1* | 9/2013 | Choi et al. .................... 257/659 |
| 2013/0309814 A1* | 11/2013 | Too et al. ...................... 438/118 |
| 2013/0320517 A1* | 12/2013 | Shirley ........................... 257/704 |
| 2014/0061893 A1* | 3/2014 | Saeidi et al. ................... 257/712 |

\* cited by examiner

PRIOR ART

FIG. 4B

PRIOR ART

FIG. 4C

PRIOR ART

FIG. 4D

PRIOR ART

FIG. 5

PRIOR ART

SEMICONDUCTOR PACKAGE WITH ALTERNATING THERMAL INTERFACE AND ADHESIVE MATERIALS AND METHOD FOR MANUFACTURING THE SAME

TECHNICAL FIELD

The present application relates to a semiconductor package and a method for manufacturing the same, and more particularly, to a semiconductor package, which can improve reliability of heat emitting performance, and a method for manufacturing the same.

BACKGROUND

Semiconductor packages are designed and manufactured in various types according to purposes and uses of the semiconductor packages. The semiconductor package typically includes a substrate, a semiconductor chip mounted on the substrate, a conductive member connecting the semiconductor chip and the substrate, and an input/output terminal for inputting/outputting external signal to/from the substrate.

According to the recent trend towards miniaturization, high integration and high performance of electronic devices, the operating speed of a semiconductor package is greatly increasing while the size thereof is gradually decreasing. According to high integration and high-speed operation of chips, the internal temperature of the semiconductor package unavoidably rises.

If the internal temperature of the semiconductor package rises, thermal stress may be applied to the semiconductor package, resulting in a malfunction of a chip circuit and a reduction in the operating speed.

FIGS. 4A-4D illustrates a conventional semiconductor package manufactured in a structure capable of increasing heat emission efficiency while reducing the size.

That is to say, in the conventional semiconductor package, since a substrate and a semiconductor chip are connected by a conductive wire, a loop height of the conductive wire is created in upward and outward directions of the semiconductor chip, making the semiconductor package bulky. In contrast, as shown in FIG. 4A-4D, metallic bumps 12 are directly formed to a bonding pad formed on one surface of a semiconductor chip 14 by a plating process, and the bumps 12 are directly conductively connected to a conductive pattern of a substrate 10, thereby manufacturing the semiconductor package which can be reduced in size.

In particular, in order to obtain a heat emission effect, the semiconductor package shown in FIGS. 4A-4D includes a heat emitting lid 16 adhered to the substrate 10 at its edge while a central portion of the heat emitting lid 16 is tightly fixed to a top surface of the semiconductor chip 14.

Figure 5:
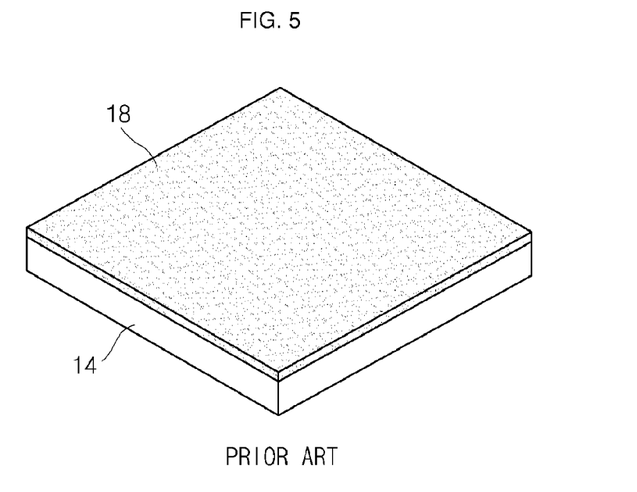
FIG. 5 is a perspective view of a semiconductor chip and thermal interface material of the semiconductor package of FIGS. 4C, 4D in accordance with the prior art.

Here, as shown in FIG. 5, an epoxy resin based thermal interface material 18 having high heat transmission efficiency is applied to the top surface of the semiconductor chip 14, and the heat emitting lid 16 is adhered to the top surface of the semiconductor chip 14.

Therefore, some of the heat generated from the semiconductor chip 14 is emitted to the outside through the substrate 10 connected by means of the bumps 12, while most of the heat generated from the semiconductor chip 14 is emitted to the outside through the heat emitting lid 16 directly fixed to the semiconductor chip 14.

However, while the thermal interface material 18 has high heat transmission efficiency, it has a poor adhesion, leading to delamination in which the heat emitting lid 16 is delaminated from the top surface of the semiconductor chip 14.

In particular, the delamination of the heat emitting lid 16 concentrates on corner regions on the top surface of the semiconductor chip 14.

If the heat emitting lid 16 is delaminated from the semiconductor chip 14, the effect of emitting the heat generated from the semiconductor chip 14 may be lowered.

BRIEF DESCRIPTION OF THE DRAWINGS

Common reference numerals are used throughout the drawings and the detailed description to indicate the same elements.

DETAILED DESCRIPTION

One embodiment features that a heat emitting lid stacked on a top surface of a semiconductor chip can be maintained at a tightly adhered state by applying a thermal interface material having high heat transmission efficiency throughout the top surface of the semiconductor chip, and applying a highly adhesive interface material to a partial region of the top surface of the semiconductor chip.

Figure 1A:
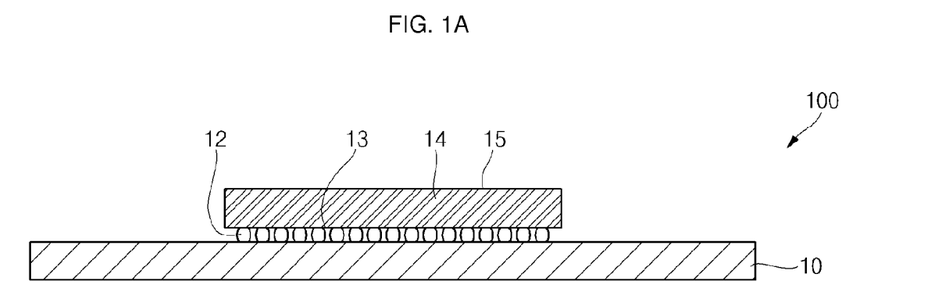
FIGS. 1A, 1B, 1C, 1D, 1E are cross-sectional views of a semiconductor package during fabrication in accordance with one embodiment.

FIGS. 1A, 1B, 1C, 1D, 1E are cross-sectional views of a semiconductor package 100 during fabrication in accordance with one embodiment. Referring to FIG. 1A, metallic bumps 12 are directly formed to a bonding pad formed on the lower surface 13, sometimes called the active surface, of a semiconductor chip 14 by a plating process, and the bumps 12 are directly conductively connected to a conductive pattern of a substrate 10, thereby completing the semiconductor package which can be greatly reduced in size. The semiconductor chip 14 further has a top surface 15, sometimes called an inactive surface, opposite the lower surface 13.

Figure 1B:
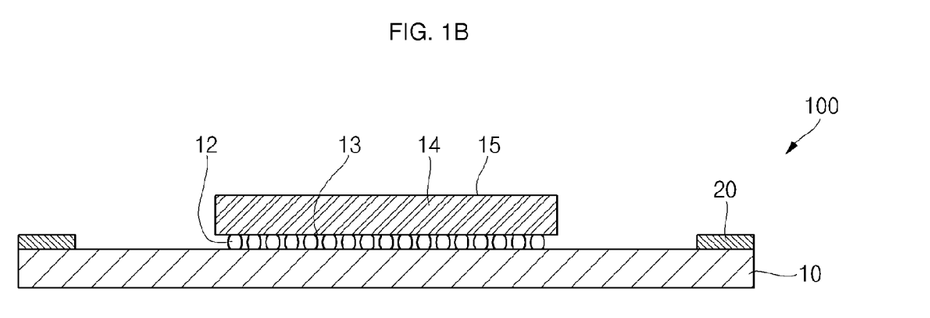

Referring to FIG. 1B, a highly adhesive interface material 20 may be applied to edge regions on the top surface of the substrate 10 to which legs of a heat emitting lid will subsequently be attached as described further below.

Figure 1C:
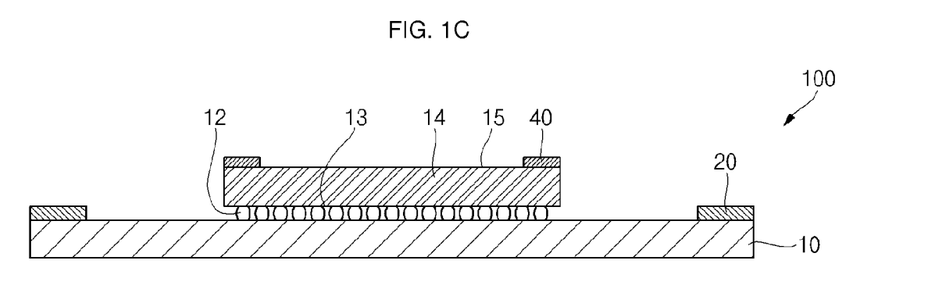
Figure 1D:
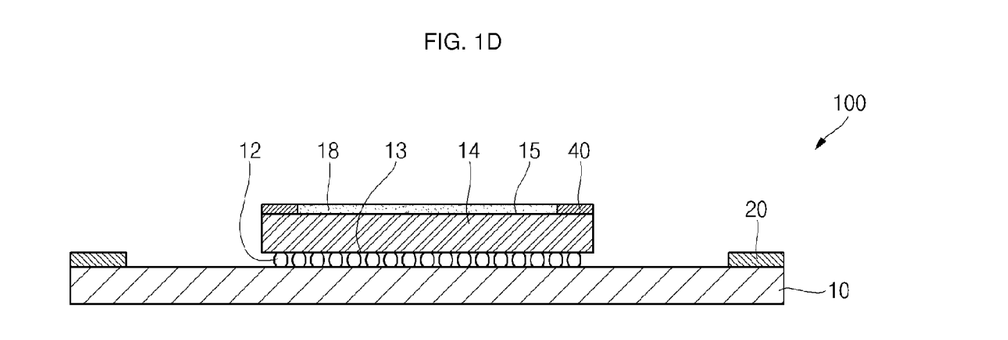
Figure 2:
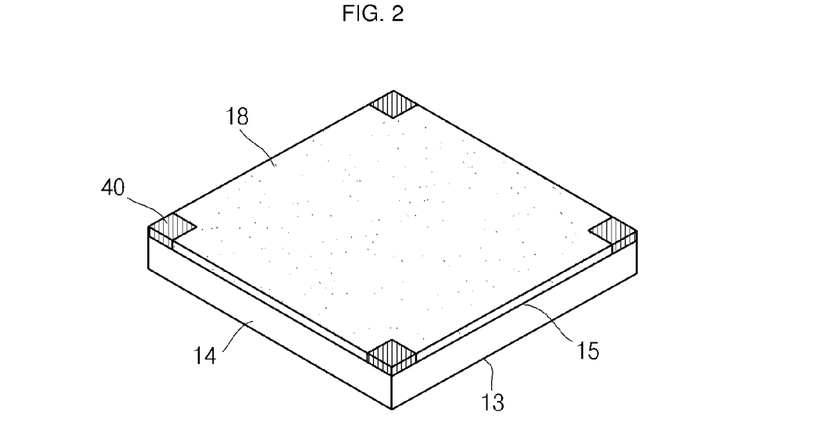
FIG. 2 is a perspective view of a semiconductor chip, a thermal interface material, and a highly adhesive interface material of the semiconductor package of FIGS. 1D, 1E in accordance with one embodiment.

Referring now to FIGS. 1C, 1D and 2 together, an epoxy resin based thermal interface material (TIM) 18 having high heat transmission efficiency is applied to the top surface 15 of the semiconductor chip 14, and a highly adhesive interface material 40, e.g., an adhesive such as an epoxy, is applied to a partial region, sometimes called an adhesion region, of the top surface 15 of the semiconductor chip 14.

In one embodiment, as illustrated in FIGS. 1C and 1D, the highly adhesive interface material 40 is applied first and the TIM 18 is applied second. However, in another embodiment, the TIM 18 is applied first and the highly adhesive interface material 40 is applied second. In yet another embodiment, the TIM 18 and the highly adhesive interface material 40 are applied simultaneously.

Generally, the portion, sometimes called region or area, of the top surface 15 of the semiconductor chip 14 to which the highly adhesive interface material 40 is applied is called an adhesion region of the top surface 15 of the semiconductor chip 14. In contrast, the portion, sometimes called region or area, of the top surface 15 of the semiconductor chip 14 to which the TIM 18 is applied is called a heat transfer region of the top surface 15 of the semiconductor chip 14.

In one embodiment, the adhesion region to which the highly adhesive interface material 40 is applied is exclusive of the heat transfer region to which the TIM 18 is applied, although there can be some overlap of the regions by overlap of the highly adhesive interface material 40 and the TIM 18. Illustratively, the adhesion region to which the highly adhesive interface material 40 is applied collectively with the heat transfer region to which the TIM 18 is applied form the entire top surface 15 of the semiconductor chip 14.

In one embodiment, the highly adhesive interface material 40 has a greater bonding strength than the TIM 18. However, the TIM 18 has a higher heat transmission efficiency, e.g., a higher heat transfer coefficient, than the highly adhesive interface material 40.

Figure 1E:
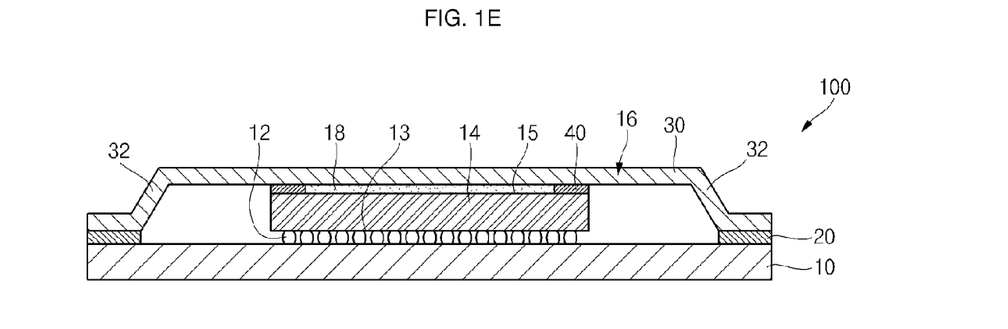

Here, referring now to FIG. 1E, in order to effectively emit the heat generated from the semiconductor chip 14 to the outside, a heat emitting lid 16, including a flat plate 30 and legs 32 integrally formed at four sides of the flat plate 30, is tightly adhered to the semiconductor chip 14.

That is to say, while the flat plate 30 of the heat emitting lid 16 is tightly fixed to the top surface 15 of the semiconductor chip 14, the legs 32 of the heat emitting lid 16, corresponding to the edges of the heat emitting lid 16, are adhered and fixed to the substrate 10.

In more detail, the TIM 18 having high heat transmission efficiency is applied throughout the top surface 15 of the semiconductor chip 14, and the highly adhesive interface material 40 is applied to the partial region of the semiconductor chip 14, thereby welding and fixing the heat emitting lid 16 to the TIM 18 so as to transmit heat while being adhered and fixed to the highly adhesive interface material 40.

Here, a highly adhesive interface material 20, sometimes called a highly adhesive substrate interface material, may be applied to edge regions on the top surface of the substrate 10 to which the legs 32 of the heat emitting lid 16 are attached, thereby fixedly attaching the legs 32 of the heat emitting lid 16 to the substrate 10.

In one embodiment, the highly adhesive interface material 20 and the highly adhesive interface material 40 are the same material, e.g., the same type of adhesive. In another embodiment, instead of the highly adhesive interface material 20, the TIM 18 having high heat transmission efficiency while having rather poor adhesion may be applied to edge regions on the top surface of the substrate 10 to which the legs 32 of the heat emitting lid 16 are attached, thereby fixedly attaching the legs 32 of the heat emitting lid 16 to the substrate 10.

Therefore, some of the heat generated from the semiconductor chip 14 is emitted to the outside through the substrate 10 connected by means of the bumps 12, while most of the heat generated from the semiconductor chip 14 is emitted to the outside through the heat emitting lid 16 by means of the TIM 18.

Here, the adhesive interface material 40 mainly serves to firmly fix the heat emitting lid 16 and has lower heat transmission efficiency than the TIM 18. However, the adhesive interface material 40 also serves to transfer the heat generated from the semiconductor chip 14 to the heat emitting lid 16.

Figure 3A:
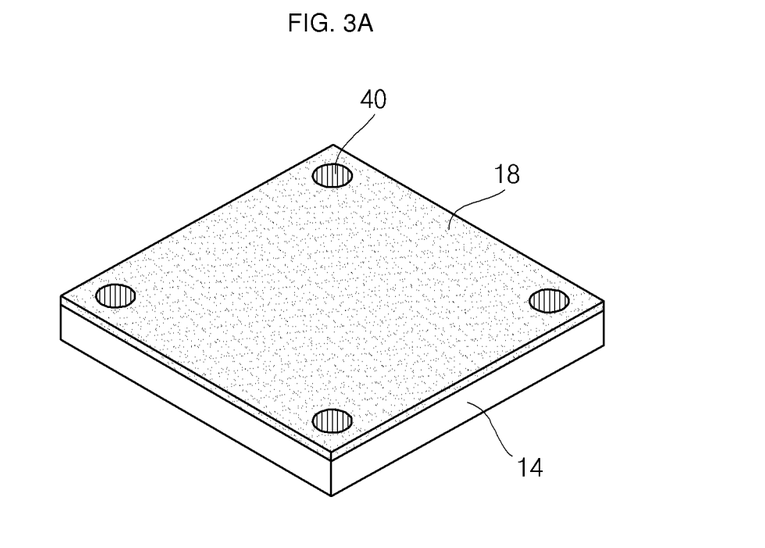
FIGS. 3A, 3B, 3C, 3D are perspective views illustrating various embodiments for applying an adhesive interface material to a semiconductor package according to various embodiments.
Figure 3B:
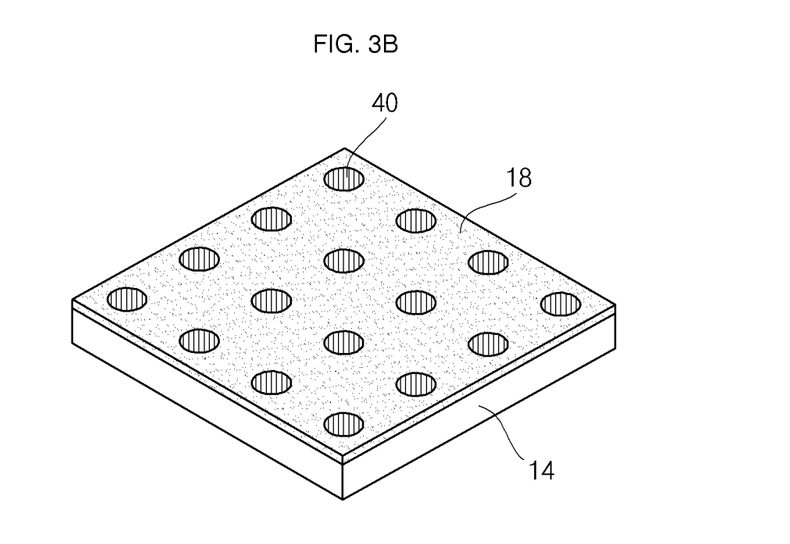
Figure 3C:
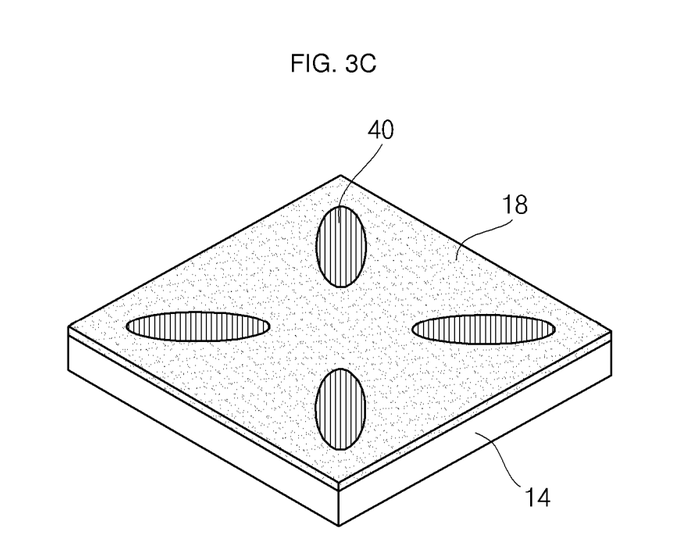

According to various embodiments, as illustrated in FIGS. 3A and 3C, since the heat transmission efficiency of the adhesive interface material 40 is slightly lower than that of the TIM 18, the adhesive interface material 40 is applied only to corner regions on the top surface 15 of the semiconductor chip 14 in a circular (FIG. 3A) or oval shape (FIG. 3C), thereby tightly adhering and supporting the heat emitting lid 16. The corner regions of the top surface 15 are regions of the top surface 15 adjacent to the corners of the top surface 15.

In addition, the TIM 18 mainly serving to emit heat is applied throughout the entire top surface 15 of the semiconductor chip 14 other than the corner regions including the adhesive interface material 40 thereon, thereby facilitating heat emission through the heat emitting lid 16.

Figure 3D:
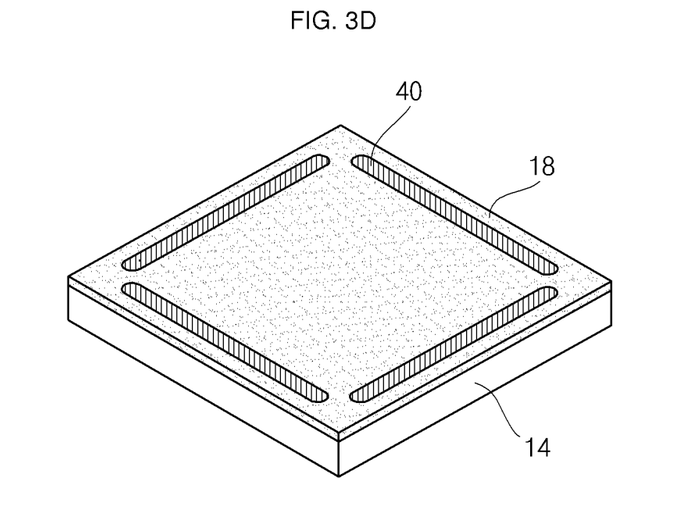
Figure 4A:
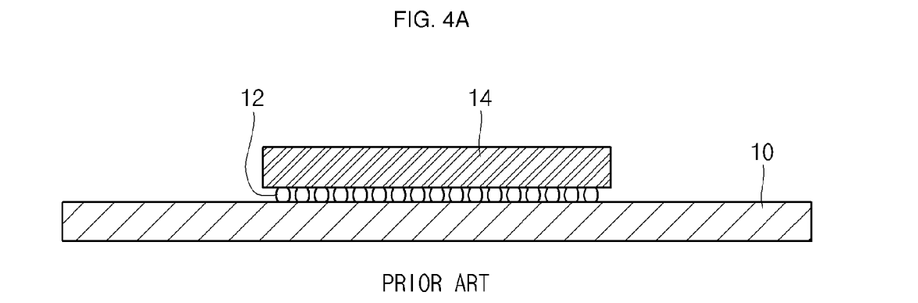
FIGS. 4A, 4B, 4C, 4D are cross-sectional views of a conventional semiconductor package during fabrication.
Figure 4B:
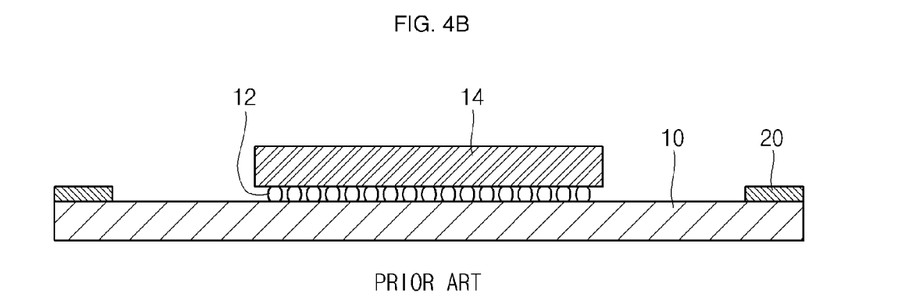
Figure 4C:
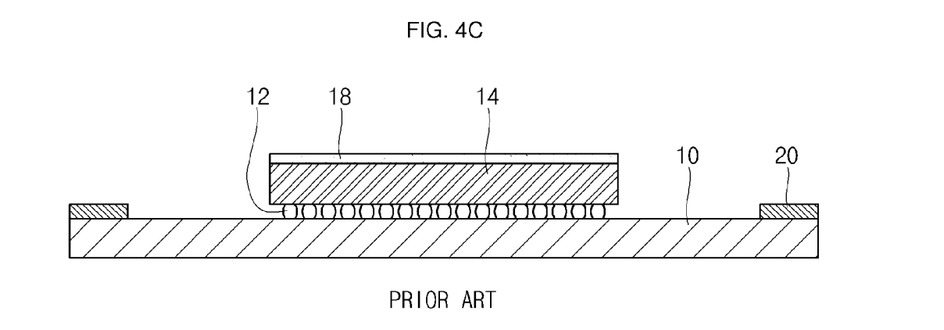
Figure 4D:
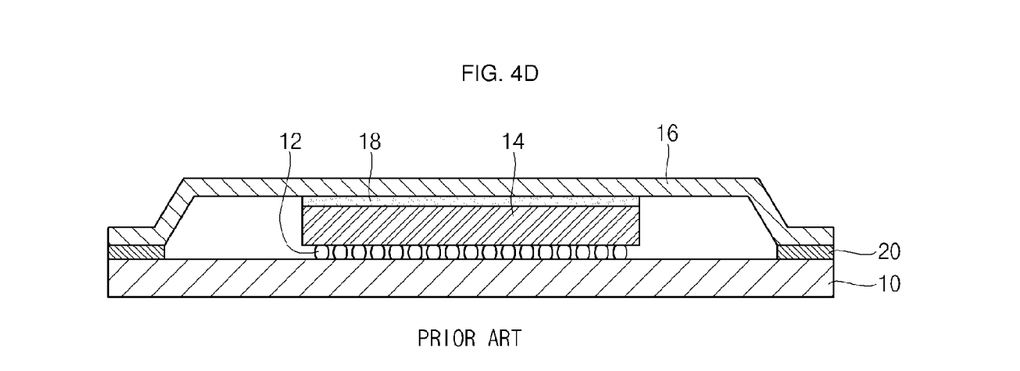

According to another embodiment, as illustrated in FIG. 3D, since the heat transmission efficiency of the adhesive interface material 40 is slightly lower than that of the TIM 18, the adhesive interface material 40 is applied only to four edge regions on the top surface 15 of the semiconductor chip 14, thereby tightly adhering and supporting the heat emitting lid 16. In addition, the TIM 18 mainly serving to emit heat is applied throughout the entire top surface 15 of the semiconductor chip 14 other than the four edge regions including the adhesive interface material 40 applied thereon, thereby facilitating heat emission through the heat emitting lid 16. The edge regions are long strip like regions of the top surface 15 adjacent the edges of the top surface 15.

According to still another embodiment, as illustrated in FIG. 3B, since the heat transmission efficiency of the adhesive interface material 40 is slightly lower than that of the TIM 18, the adhesive interface material 40 is simultaneously applied to a central portion, the corner regions and the edge regions on the top surface 15 of the semiconductor chip 14, thereby more tightly adhering and supporting the heat emitting lid 16. In addition, the TIM 18 mainly serving to emit heat is applied throughout the entire surface of the semiconductor chip 14 other than the central portion, the corner regions and the edge regions including the adhesive interface material 40, thereby facilitating heat emission through the heat emitting lid 16. The central portion of the top surface 15 of the semiconductor chip 14 is the region at the center of the top surface 15 of the semiconductor chip 14.

As described above, the adhesive interface material 40 is applied in a circular, oval or polygonal shape to the top surface 15 of the semiconductor chip 14 in a dotted manner together with the TIM 18. While the heat emitting lid 16 is adhered to the semiconductor chip 14, the dotted adhesive interface material 40 spreads, thereby easily adhering the adhesive interface material 40 to the heat emitting lid 16.

As described above, the TIM 18 having high heat transmission efficiency is applied to the top surface 15 of the semiconductor chip 14 mounted on the substrate 10 while applying the highly adhesive interface material 40 to a partial region of the top surface 15 of the semiconductor chip 14, thereby firmly adhering and fixing the heat emitting lid 16 stacked on the top surface 15 of the semiconductor chip 14. Accordingly, it is possible to prevent the heat emitting lid 16 from being delaminated from the semiconductor chip 14, thereby improving the reliability of heat emission performance.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process, may be implemented by one skilled in the art in view of this disclosure.

What is claimed is:

1. A semiconductor package comprising:
a semiconductor chip comprising an inactive surface;
an adhesive interface material adhered to an adhesive region of the inactive surface;
a thermal interface material adhered to a heat transfer region of the inactive surface; and
a heat emitting lid adhered to the inactive surface by the adhesive interface material and the thermal interface material, wherein the adhesive interface material has a greater bonding strength than the thermal interface material.

2. The semiconductor package of claim 1 wherein the thermal interface material has a higher heat transmission efficiency than the adhesive interface material.

3. The semiconductor package of claim 1 wherein the adhesive region and the heat transfer region form the entire inactive surface.

4. The semiconductor package of claim 1 further comprising:
a substrate; and
conductive bumps coupling an active surface of the semiconductor chip to the substrate.

5. The semiconductor package of claim 4 wherein the heat emitting lid comprises:
a flat plate adhered to the inactive surface; and
legs adhered to the substrate.

6. The semiconductor package of claim 5 comprising an adhesive substrate interface material adhering the legs to the substrate.

7. The semiconductor package of claim 6 wherein the adhesive substrate interface material and the adhesive interface material are the same type of material.

8. The semiconductor package of claim 1, wherein the adhesive region comprises corner regions on the inactive surface of the semiconductor chip.

9. The semiconductor package of claim 1, wherein the adhesive region comprises edge regions on the inactive surface of the semiconductor chip.

10. The semiconductor package of claim 1, wherein the adhesive region comprises a central portion, corner regions and edge regions on the inactive surface of the semiconductor chip.

11. The semiconductor package of claim 1, wherein the adhesive interface material is applied in a shape comprising one or more of the following: a circle, an oval and a polygon with rounded edges.

12. A semiconductor package comprising:
a substrate;
a semiconductor chip;
bumps conductively attaching the semiconductor chip to the substrate;
a heat emitting lid attached to an inactive surface of the semiconductor chip and edge regions of a top surface of the substrate, wherein the heat emitting lid is adhered and fixed to a highly adhesive interface material while also being adhered to a thermal interface material having a high heat transmission efficiency throughout the inactive surface of the semiconductor chip, the highly adhesive interface material being applied to an adhesive region of the inactive surface of the semiconductor chip and the thermal interface material being applied at a heat transfer region of the inactive surface of the semiconductor chip different from the adhesive region.

13. The semiconductor package of claim 12, wherein the adhesive interface material is applied to corner regions on the inactive surface of the semiconductor chip.

14. The semiconductor package of claim 12, wherein the adhesive interface material is applied to edge regions on the inactive surface of the semiconductor chip.

15. The semiconductor package of claim 12, wherein the adhesive interface material is applied to a central portion, corner regions and edge regions on the inactive surface of the semiconductor chip.

16. The semiconductor package of claim 12, wherein the adhesive interface material is applied in a shape comprising one or more of the following: a circle, an oval and a polygon with rounded edges.

17. The semiconductor package of claim 12, wherein the heat emitting lid is adhered to the inactive surface of the semiconductor chip and to the edge regions of the top surface of the substrate using a same adhesive.

18. The semiconductor package of claim 12, wherein the adhesive interface material has a greater bonding strength than the thermal interface material, and the thermal interface material has a higher heat transmission efficiency than the adhesive interface material.

19. A semiconductor package comprising:
a substrate;
a semiconductor chip comprising an active surface and an inactive surface;
bumps conductively attaching the active surface of the semiconductor chip to the substrate;
a heat emitting lid attached to the inactive surface of the semiconductor chip using both an epoxy-based adhesive material and an epoxy resin-based thermal interface material.

20. A method for a semiconductor package, the method comprising:
providing a semiconductor package, the package comprising:
a semiconductor chip comprising an inactive surface;
an adhesive interface material adhered to an adhesive region of the inactive surface;
a thermal interface material adhered to a heat transfer region of the inactive surface; and
a heat emitting lid adhered to the inactive surface by the adhesive interface material and the thermal interface material, wherein the adhesive interface material has a greater bonding strength than the thermal interface material.

21. The method of claim 20 wherein the thermal interface material has a higher heat transmission efficiency than the adhesive interface material.

22. The method of claim 20 wherein the adhesive region and the heat transfer region form the entire inactive surface.

* * * * *